(12) United States Patent
Nagai

(10) Patent No.: US 9,536,890 B2
(45) Date of Patent: Jan. 3, 2017

(54) SEMICONDUCTOR TRANSISTOR AND FLASH MEMORY, AND MANUFACTURING METHOD THEREOF

(71) Applicant: Powerchip Technology Corporation, Hsinchu (TW)

(72) Inventor: Yukihiro Nagai, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 16 days.

(21) Appl. No.: 14/675,754

(22) Filed: Apr. 1, 2015

(65) Prior Publication Data

US 2016/0293616 A1 Oct. 6, 2016

(51) Int. Cl.
| | |
|---|---|
| *H01L 27/115* | (2006.01) |
| *H01L 29/788* | (2006.01) |
| *H01L 29/78* | (2006.01) |
| *H01L 29/51* | (2006.01) |
| *H01L 29/66* | (2006.01) |

(52) U.S. Cl.
CPC ....... *H01L 27/11526* (2013.01); *H01L 29/513* (2013.01); *H01L 29/66492* (2013.01); *H01L 29/66825* (2013.01); *H01L 29/788* (2013.01); *H01L 29/7833* (2013.01)

(58) Field of Classification Search
CPC .............................................. H01L 27/11526
USPC ....................................................... 257/316
See application file for complete search history.

(56) References Cited

U.S. PATENT DOCUMENTS

| | | | |
|---|---|---|---|
| 5,516,711 A * | 5/1996 | Wang | H01L 21/26586 257/E21.345 |
| 6,232,183 B1 | 5/2001 | Chen et al. | |
| 8,536,634 B2 | 9/2013 | Aritome | |
| 2007/0293029 A1* | 12/2007 | Ogawa | H01L 21/82346 438/585 |
| 2012/0231599 A1* | 9/2012 | Koo | H01L 21/0206 438/289 |
| 2016/0064082 A1* | 3/2016 | Hong | H01L 27/11546 365/185.05 |

OTHER PUBLICATIONS

Office Action of Taiwan Counterpart Application, issued on Jun. 8, 2016, p. 1-6.

* cited by examiner

*Primary Examiner* — Kenneth Parker
*Assistant Examiner* — Warren H Kilpatrick
(74) *Attorney, Agent, or Firm* — Jianq Chyun IP Office

(57) ABSTRACT

A flash memory disposed on a substrate is provided. The flash memory includes a semiconductor transistor including stacked gate structures, lightly doped regions and spacers. The stacked gate structures include a gate dielectric layer, a first conductive layer, a dielectric layer and a second conductive layer sequentially disposed on the substrate. The dielectric layer has an opening there around such that the first conductive layer electrically connects with the second conductive layer. The lightly doped regions are disposed in the substrate under the opening at sides of the stacked gate structures. The spacers are disposed on sidewalls of the stacked gate structures. A width of spacers is adjusted by controlling a height of the first conductive layer under the opening. The lightly doped regions are disposed by using the dielectric layer as a mask layer, so as to gain margins of the lightly doped regions for good electrical properties.

19 Claims, 10 Drawing Sheets

SEMICONDUCTOR TRANSISTOR AND FLASH MEMORY, AND MANUFACTURING METHOD THEREOF

BACKGROUND

Technical Field

The invention relates to a semiconductor device and a manufacturing method thereof, and particularly relates to a semiconductor transistor and a flash memory and a manufacturing method thereof.

Related Art

Since a non-volatile memory is capable of implementing data storage, data reading and data erasing operations for multiple times, and data stored therein is not disappeared after power-off, the non-volatile memory is widely used in personal computers and electronic equipment.

A typical non-volatile memory includes a memory cell region and a peripheral circuit region. In the memory cell region, a plurality of memory units and standard operating voltage transistors as switch transistors are disposed. In the peripheral circuit region, various semiconductor transistors with different operation voltages are disposed according to an actual requirement. Generally, a plurality of standard operating voltage transistors (core transistors), a plurality of middle operating voltage transistors or high operating voltage transistors are disposed in the peripheral circuit region. The semiconductor transistors with different operation voltages are required to have different structures according to electrical performances thereof.

However, in the typical non-volatile memory, the memory units, the standard operating voltage transistors, and middle operating voltage transistors and/or high operating voltage transistors are formed together in a same manufacturing process. Regarding a middle operating voltage transistor or a high operating voltage transistor, in order to avoid generating a leakage current, a lightly doped drain (LDD) structure with a large width is formed in a substrate between a source/drain region and a gate.

Taking an NAND flash memory as an example, during the manufacturing process, the middle operating voltage transistors or the high operating voltage transistors are not easy to get a wide LDD, so that a offset a spacer overlay margin is required, i.e. an extra lithography etching process is needed to widen the LDD of the middle operating voltage transistors or the high operating voltage transistors. Taking an embedded flash memory as an example, in the manufacturing process, the width of the LDD of the middle operating voltage transistor or the high operating voltage transistor can be determined by a width of the spacer of the middle operating voltage transistor or the high operating voltage transistor, and the width of the spacer is influenced by a height of the gate. In case that a height the gate of the middle operating voltage transistor or the high operating voltage transistor is lower than a height of the stacked gate structure of the memory unit or a height of a gate of the standard operating voltage transistor, the wide LDD cannot be achieved, which influences properties of the semiconductor device.

SUMMARY

The invention is directed to a semiconductor transistor and a manufacturing method thereof, by which margins of lightly doped regions of the semiconductor transistor are gained to achieve good electrical properties of the semiconductor transistor, and the manufacturing method is adapted to be integrated with an existing manufacturing process.

The invention is directed to a flash memory and a manufacturing method thereof, by which memory units, a first semiconductor transistor and a second semiconductor transistor are formed together in a same manufacturing process, such that margins of lightly doped regions of the second semiconductor transistor are gained to achieve good electrical properties of the second semiconductor transistor, and the manufacturing method is adapted to be integrated with an existing manufacturing process.

The invention provides a semiconductor transistor, which is disposed on a substrate. The semiconductor transistor includes a stacked gate structure, lightly doped regions, source/drain regions. The stacked gate structure includes a gate dielectric layer, a first conductive layer, a dielectric layer and a second conductive layer sequentially disposed on the substrate, where the dielectric layer has an opening there around such that the first conductive layer is electrically connected to the second conductive layer. The lightly doped regions are disposed in the substrate under the opening at sides of the stacked gate structure. The source/drain regions are disposed in the substrate at sides of the stacked gate structure.

In an embodiment of the invention, the semiconductor transistor is a middle operating voltage transistor or a high operating voltage transistor.

In an embodiment of the invention, the dielectric layer is silicon oxide/silicon nitride/silicon oxide.

The invention provides a manufacturing method for a semiconductor transistor, which includes following steps. First, a substrate is provided, and a gate dielectric layer, a first conductive layer and a dielectric layer are sequentially formed on the substrate. Then, a part of the dielectric layer is removed to form an opening exposing the first conductive layer. Then, a second conductive layer is formed on the substrate, where the second conductive layer is electrically connected to the first conductive layer though the opening. Then, the second conductive layer, the first conductive layer and the gate dielectric layer are patterned to form a stacked gate structure, where the dielectric layer is located in the stacked gate structure, and the opening surrounds the dielectric layer. Then, lightly doped regions are formed in the substrate under the opening at sides of the stacked gate structure, and source/drain regions are formed in the substrate at sides of the stacked gate structure.

In an embodiment of the invention, the dielectric layer is silicon oxide/silicon nitride/silicon oxide.

In an embodiment of the invention, the step of forming the lightly doped regions in the substrate under the opening at sides of the stacked gate structure includes performing title angle ion implantation by using the dielectric layer as a mask.

In an embodiment of the invention, the step of removing a part of the dielectric layer to form the opening exposing the first conductive layer further includes removing a part of the first conductive layer.

The invention provides a flash memory, which is disposed on the substrate, and the substrate includes a memory cell region, a first circuit region and a second circuit region. The flash memory has a memory unit, a first semiconductor transistor and a second semiconductor transistor. The memory unit is disposed in the memory cell region, and includes a tunnelling dielectric layer, a floating gate, an inter-gate dielectric layer and a control gate sequentially disposed on the substrate. The first semiconductor transistor is disposed in the first circuit region, and includes a gate structure and first source/drain regions. The gate structure includes a first gate dielectric layer and a first gate sequentially disposed on the substrate. The first source/drain regions are disposed in the substrate at sides of the gate structure. The second semiconductor transistor is disposed in the second circuit region, and includes a stacked gate structure, first lightly doped regions, second source/drain regions. The stacked gate structure includes a second gate dielectric layer, a first conductive layer, a dielectric layer and a second conductive layer sequentially disposed on the substrate, where the dielectric layer has an opening there around such that the first conductive layer is electrically connected to the second conductive layer to form a second gate. The first lightly doped regions are disposed in the substrate under the opening at sides of the stacked gate structure. The second source/drain regions are disposed in the substrate at sides of the stacked gate structure.

In an embodiment of the invention, materials of the inter-gate dielectric layer and the dielectric layer are the same.

In an embodiment of the invention, the height of the second gate is greater than the height of the first gate.

In an embodiment of the invention, the flash memory further includes spacers respectively disposed at sidewalls of the memory unit, the gate structure and the stacked gate structure.

In an embodiment of the invention, in the flash memory, a width of the spacer of the second semiconductor transistor is greater than a width of the spacer of the first semiconductor transistor.

In an embodiment of the invention, the first semiconductor transistor is a standard operating voltage transistor.

In an embodiment of the invention, the second semiconductor transistor is a middle operating voltage transistor or a high operating voltage transistor.

In an embodiment of the invention, the first semiconductor transistor further includes second lightly doped regions disposed in the substrate between the gate structure and the first source/drain regions.

The invention provides a manufacturing method for a flash memory, which includes following steps. First, a substrate is provided, where the substrate includes a memory cell region, a first circuit region and a second circuit region. Then, a first dielectric layer is formed on the substrate at the second circuit region, a second dielectric layer is formed on the substrate at the memory cell region, and a third dielectric layer is formed on the substrate at the first circuit region. Then, a first conductive layer is formed on the substrate, and a dielectric layer is formed on the first conductive layer. Then, the dielectric layer in the first circuit region and a part of the dielectric layer in the second circuit region are removed, and an opening exposing the first conductive layer is formed around the dielectric layer at the second circuit region. Then, the first conductive layer in the first circuit region is removed. Then, a second conductive layer is formed on the substrate, where in the second circuit region, the second conductive layer is electrically connected to the first conductive layer through the opening. Then, the second conductive layer, the dielectric layer and the first conductive layer are patterned to form a memory unit in the memory cell region, a gate structure in the first circuit region and a stacked gate structure in the second circuit region, and in the stacked gate structure, the opening surrounds the dielectric layer.

Then, lightly doped regions are formed in the substrate under the opening at sides of the stacked gate structure, and source/drain regions are formed in the substrate at sides of the stacked gate structure.

In an embodiment of the invention, the dielectric layer is silicon oxide/silicon nitride/silicon oxide.

In an embodiment of the invention, the step of forming the lightly doped region in the substrate under the opening at sides of the stacked gate structure includes performing a title angle ion implantation by using the dielectric layer as a mask.

In an embodiment of the invention, the step of removing a part of the dielectric layer to form the opening exposing the first conductive layer further includes removing a part of the first conductive layer.

According to the above descriptions, in the semiconductor transistor and the manufacturing method thereof, the dielectric layer having the opening there around is disposed in the semiconductor transistor. The dielectric layer having the opening there around is used as a mask to remove a part of the first conductive layer, such that a height of a center of the gate is greater than a height of a periphery of the gate. In this way, the width of the spacer of the semiconductor transistor can be adjusted to gain margins of the lightly doped regions of the semiconductor transistor, so as to achieve good electrical properties of the semiconductor transistor.

In the semiconductor transistor and the manufacturing method thereof, since the dielectric layer having the opening there around is disposed in the semiconductor transistor, when the lightly doped regions are formed, the dielectric layer having the opening there around is used as an implantation mask, and the lightly doped regions extend to the underneath of the gate.

In the semiconductor transistor and the manufacturing method thereof, since the gate of the semiconductor transistor is composed of two layers of conductive layers, a height of the gate of the second semiconductor transistor is greater than a height of the gate of the first semiconductor transistor.

In the flash memory and the manufacturing method thereof, the memory unit, the first semiconductor transistor and the second semiconductor transistor are formed together in a same manufacturing process. The dielectric layer having the opening there around is disposed in the second semiconductor transistor, and a part of the first conductive layer is removed by using the dielectric layer having the opening there around as a mask, such that a height of a center of the gate is higher than a height of a periphery of the gate. In this way, the width of the spacers of the second semiconductor transistor can be adjusted to gain margins of the lightly doped regions of the second semiconductor transistor, so as to achieve good electrical properties of the second semiconductor transistor.

In the flash memory and the manufacturing method thereof, the dielectric layer having the opening there around is disposed in the second semiconductor transistor. When the lightly doped regions are formed, the dielectric layer having the opening there around is used as an implantation mask, and the lightly doped regions extend to the underneath of the gate.

In the flash memory and the manufacturing method thereof, since the gate of the second semiconductor transistor is composed of two layers of conductive layers, a height of the gate of the second semiconductor transistor is greater than a height of the gate of the first semiconductor transistor.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
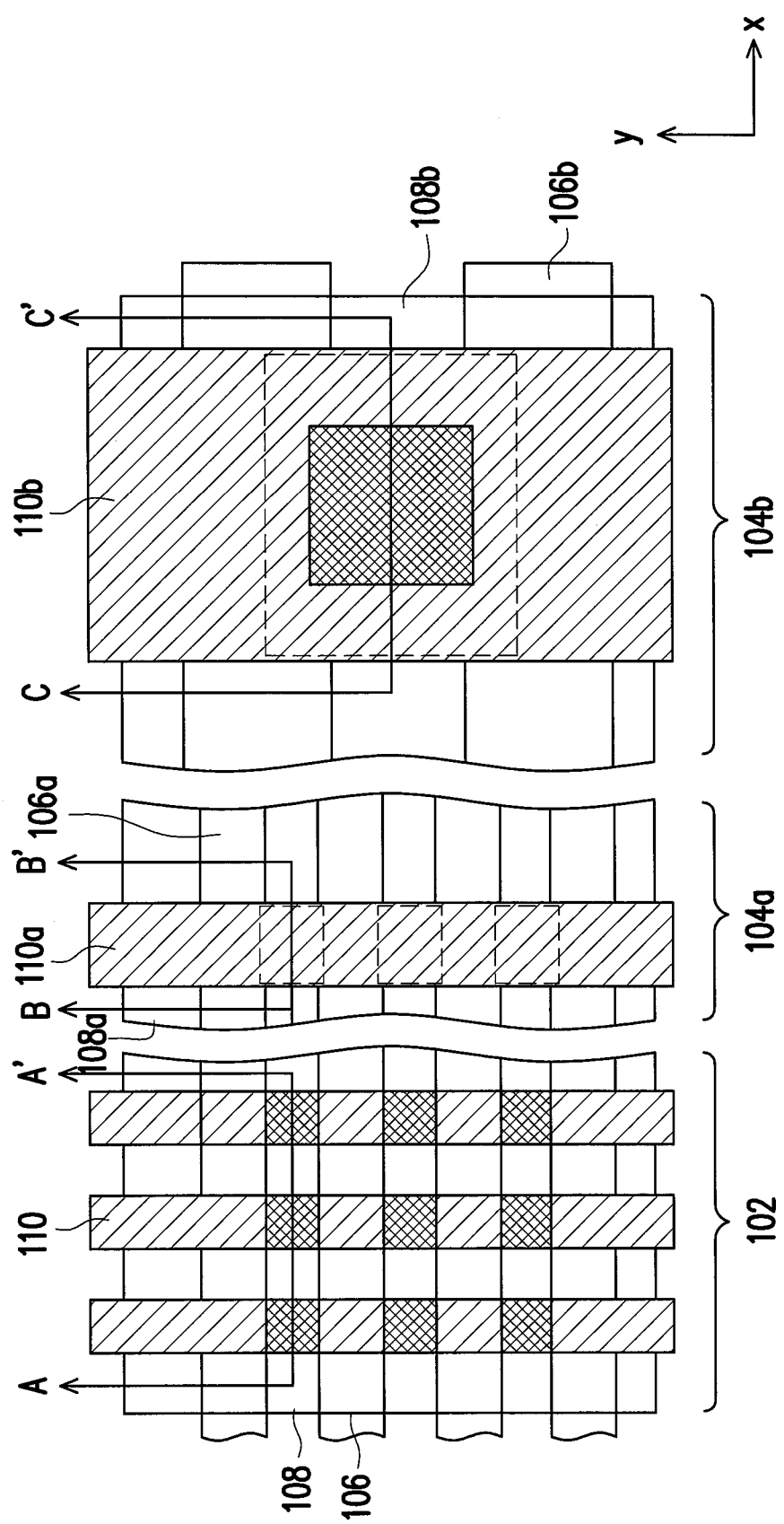
FIG. 1A is a top view of a flash memory according to an embodiment of the invention.
Figure 1B:
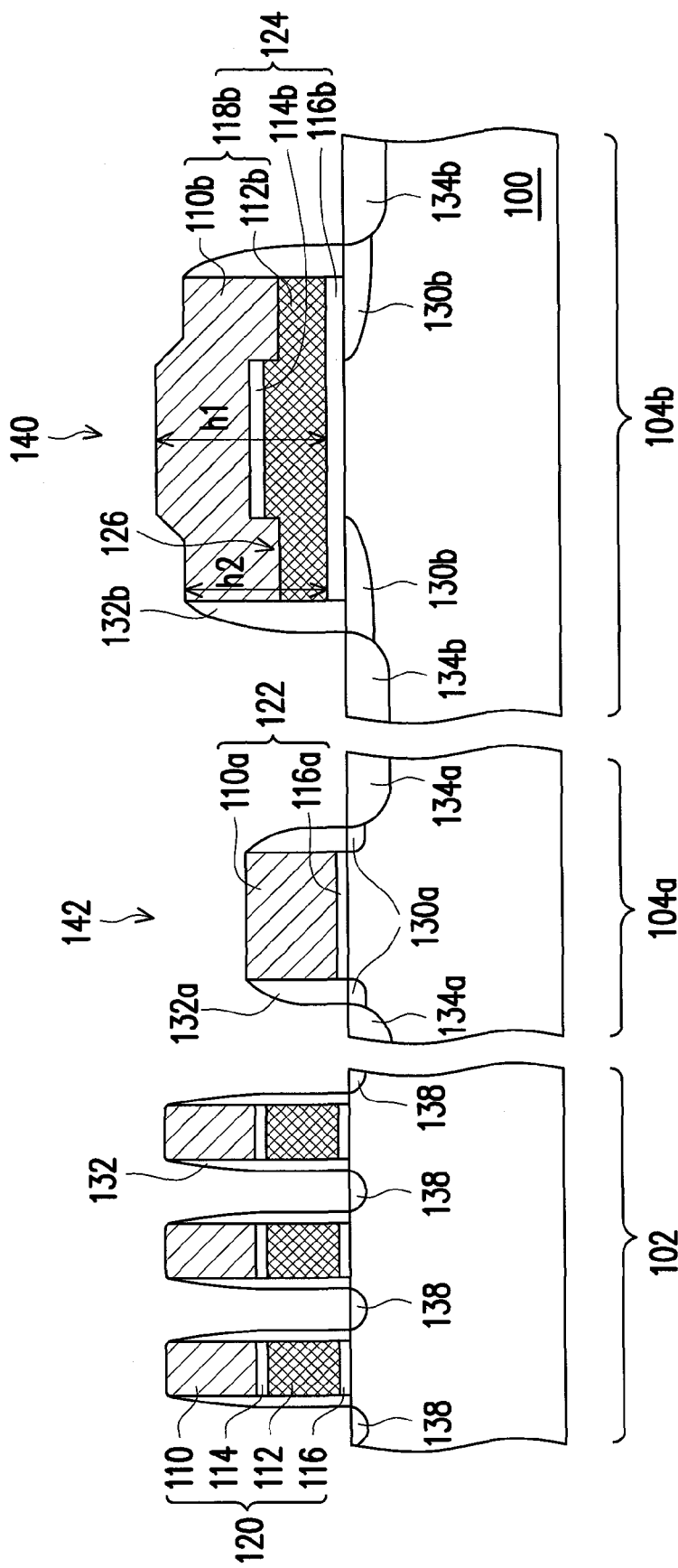
FIG. 1B is a cross-sectional view of a flash memory according to an embodiment of the invention.

FIG. 1A is a top view of a flash memory according to an embodiment of the invention. FIG. 1B is a cross-sectional view of a flash memory according to an embodiment of the invention.

Referring to FIG. 1A and FIG. 1B, the flash memory is disposed on a substrate 100. The substrate 100 includes, for example, a memory cell region 102, a first circuit region 104a and a second circuit region 104b.

Isolation structures 106 are, for example, disposed in the substrate 100 of the memory cell region 102 to define active regions 108 in the memory cell region 102. Moreover, isolation structures 106a are, for example, disposed in the substrate 100 of the first circuit region 104a to define active regions 108a in the first circuit region 104a. Besides, isolation structures 106b are, for example, disposed in the substrate 100 of the second circuit region 104b to define active regions 108b in the second circuit region 104b. The isolation structures 106, the isolation structures 106a and the isolation structures 106b are, for example, respectively disposed in the substrate 100 in parallel.

The isolation structures 106, the isolation structures 106a and the isolation structures 106b, for example, extend along an X-direction. The isolation structures 106, the isolation structures 106a and the isolation structures 106b are, for example, shallow trench isolation structures.

The memory cell region 102 has memory units 120, and each memory unit 120 includes a tunnelling dielectric layer 116, a floating gate 112, an inter-gate dielectric layer 114 and a control gate (a word line) 110 sequentially disposed on the substrate 100.

The control gate (the word line) 110 extends along a Y-direction, where the Y-direction is, for example, intersected with the X-direction. The control gate (the word line) 110 is, for example, composed of two layers of conductive layers. Certainly, the control gate (the word line) 110 can also be composed of one layer of conductive layer. A material of the control gate (the word line) 110 is, for example, one layer of doped polysilicon layer and one layer of metal layer or metal silicide layer.

The floating gate 112 is, for example, disposed under the control gate 110, and is located on the active region 108 between two adjacent isolation structures 106. A material of the floating gate 112 is, for example, a conductive material such as doped polysilicon, etc.

The inter-gate dielectric layer 114 is, for example, disposed between the control gate 110 and the floating gate 112. A material of the inter-gate dielectric layer 114 includes a dielectric material, for example, silicon oxide, silicon nitride, silicon oxynitride. The inter-gate dielectric layer 114 can be a single layer structure, or can be a multi-layer structure of more than one layer, for example, silicon oxide/silicon nitride or silicon oxide/silicon nitride/silicon oxide, etc.

The tunnelling dielectric layer 116 is, for example, disposed between the floating gate 112 and the substrate 100. A material of the tunnelling dielectric layer 116 is, for example, silicon oxide.

A spacer 132 is disposed at a sidewall of the memory unit 120. A material of the spacer 132 is, for example, silicon nitride.

In the memory cell region 102, the memory units 120 form a memory cell row. Doped regions 138 are respectively disposed in the substrate 100 at sides of the memory units 120, and the two outermost doped regions relative to the memory cell row serve as source/drain regions.

A first semiconductor transistor 142 is disposed in the first circuit region 104a. The first semiconductor transistor is, for example, a standard operating voltage transistor. For example, the first semiconductor transistor is a switch transistor of memory unit, or a core transistor or input/output transistor in peripheral circuit region. The first semiconductor transistor 142 includes a gate structure 122, lightly doped regions 130a, a spacer 132a and source/drain regions 134a. The gate structure 122 includes a gate dielectric layer 116a and a gate 110a sequentially disposed on the substrate 100.

In another embodiment, there could be no lightly doped regions 130a in the first semiconductor 142. The first semiconductor transistor 142 consist essentially of a gate structure 122, a spacer 132a and source/drain regions 134a.

The gate 110a extends along a Y-direction, where the Y-direction is, for example, intersected with the X-direction. In another embodiment, the gate 110a extends along the X-direction, and the gate 110a may extend along any direction. The gate 110a is, for example, composed of two layers of conductive layers. Certainly, the gate 110a can also be composed of one layer of conductive layer. A material of the gate 110a is, for example, one layer of doped polysilicon layer and one layer of metal layer or metal silicide layer.

The gate dielectric layer 116a is, for example, disposed between the gate 110a and the substrate 100. A material of the gate dielectric layer 116a is, for example, silicon oxide.

The lightly doped regions 130a are, for example, disposed in the substrate 100 at sides of the gate structure 122. The lightly doped regions 130a are, for example, N-type or P-type doped regions, which are determined according to a device design.

A spacer 132a is disposed at a sidewall of the gate structure 122. A material of the spacer 132a is, for example, silicon nitride.

The source/drain regions 134a are disposed in the substrate 100 at sides of the spacer 132a of the first semiconductor 142. The source/drain regions 134a are, for example, N-type or P-type doped regions, which are determined according to a device design.

A second semiconductor transistor 140 is disposed in the second circuit region 104b. The second semiconductor transistor 140 is, for example, a middle operating voltage transistor or a high operating voltage transistor. The second semiconductor transistor 140 includes a stacked gate structure 124, lightly doped regions 130b, spacers 132b, and source/drain regions 134b.

The stacked gate structure 124 includes a gate dielectric layer 116b, a conductive layer 112b, a dielectric layer 114b and a conductive layer 110b sequentially disposed on the substrate 100.

The gate dielectric layer 116b is, for example, disposed between the conductive layer 112b and the substrate 100, and a material of the gate dielectric layer 116b is, for example, silicon oxide.

A material of the conductive layer 112b is, for example, a conductive material such as doped polysilicon. A material of the conductive layer 110b is, for example, one layer of doped polysilicon layer and one layer of metal layer or metal silicide layer. The conductive layer 110b and the conductive layer 112b construct a gate 118b.

The dielectric layer 114b is, for example, disposed between the conductive layer 110b and the conductive layer 112b. The dielectric layer 114b has an opening 126 there around, such that the conductive layer 110b is electrically connected to the conductive layer 112b. A material of the dielectric layer 114b includes a dielectric material, for example, silicon oxide, silicon nitride, silicon oxynitride. The dielectric layer 114b can be a single layer structure, or can be a multi-layer structure of more than one layer, for example, silicon oxide/silicon nitride or silicon oxide/silicon nitride/silicon oxide, etc.

The lightly doped regions 130b are disposed in the substrate 100 under the opening 126 at sides of the stacked gate structure 124. The lightly doped regions 130b are, for example, an N-type or P-type doped region, which is determined according to a device design. The lightly doped regions 130b can extend in a part of the substrate under the dielectric layer 114b.

The spacers 132b are disposed at a sidewall of the stacked gate structure 124, and a material of the spacers 132b is, for example, silicon nitride. The source/drain regions 134b are disposed in the substrate 100 at sides of the stacked gate structure 124 having the spacers 132b. The source/drain 134b regions are, for example, N-type or P-type doped regions, which are determined according to a device design.

In the flash memory of the invention, a height of the gate 118b of the second semiconductor transistor 140 is greater than a height of the gate 110a of the first semiconductor transistor 142, such that a width of the spacers 132b of the second semiconductor transistor 140 is greater than a width of the spacer 132a of the first semiconductor transistor 142.

Moreover, the width of the spacers 132b of the second semiconductor transistor 140 can be adjusted by adjusting a height of the conductive layer 112b under the opening 126 of the dielectric layer 114b. Since the second semiconductor transistor 140 has the wide spacers 132b, the second semiconductor transistor 140 has wide lightly doped regions 130b, such that margins of the lightly doped regions 130b of the second semiconductor transistor 140 are gained to achieve good electrical properties of the second semiconductor transistor 140.

Moreover, in the second semiconductor transistor 140, the dielectric layer 114b having the opening 126 there around is disposed. When the lightly doped regions 130b are formed, the dielectric layer 114b having the opening 126 there around is used as an implantation mask, and the lightly doped regions 130b can extend to the underneath of the gate 118b, so as to gain the margins of the lightly doped regions 130b of the second semiconductor transistor 140 to achieve good electrical properties of the second semiconductor transistor 140.

In the second semiconductor transistor 140, the dielectric layer 114b having the opening 126 there around is disposed, and by controlling a height of conductive layer 112b exposed by the opening 126, a height h1 of a center of the gate 118b is greater than a height h2 of a periphery of the gate 118b. In this way, the width of the spacers 132b of the second semiconductor transistor 140 can be adjusted to gain the margin of the lightly doped regions 130b of the second semiconductor transistor 140, so as to achieve good electrical properties of the second semiconductor transistor 140.

FIG. 2A to FIG. 2H are cross-sectional views of a manufacturing process of a flash memory according to an embodiment of the invention.

Figure 2A:
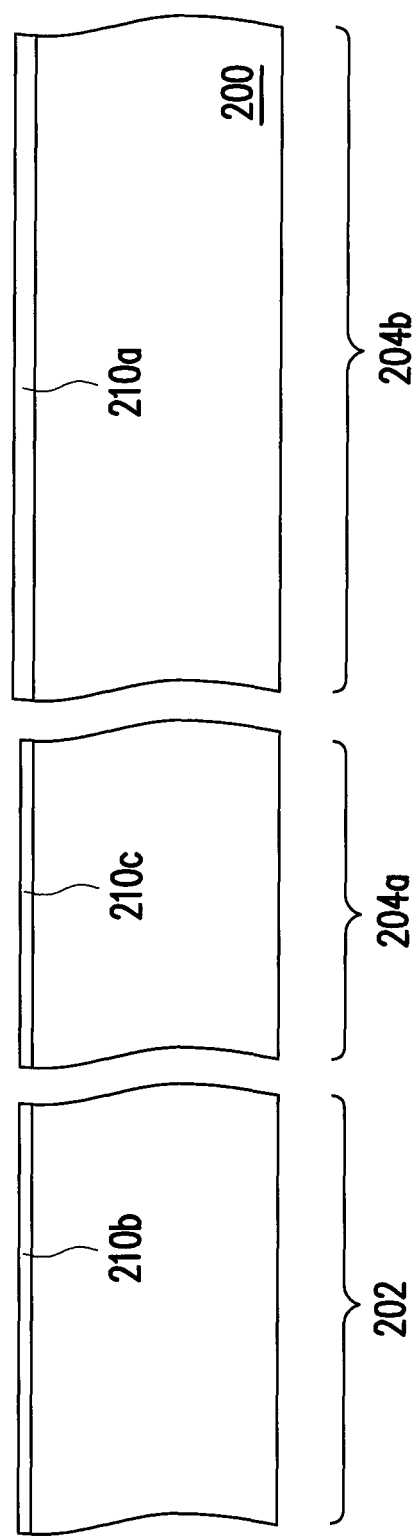
FIG. 2A to FIG. 2H are cross-sectional views of a manufacturing process of a flash memory according to an embodiment of the invention.

Referring to FIG. 2A, first, a substrate 200 is provided. The substrate 200 includes, for example, a memory cell region 202, a first circuit region 204a and a second circuit region 204b.

Then, a dielectric layer 210a is formed on the substrate 200 at the second circuit region 204b. A dielectric layer 210b is formed on the substrate 200 at the memory cell region 202. A dielectric layer 210c is formed on the substrate 200 at the first circuit region 204a. According to a device characteristic, thickness of the dielectric layer 210a, the dielectric layer 210b and the dielectric layer 210c can be different or the same. A method of forming the dielectric layer 210a, the dielectric layer 210b and the dielectric layer 210c with different thickness in the memory cell region 202, the first circuit region 204a and the second circuit region 204b can be any known method. For example, the dielectric layer 210a is first formed on the substrate 200, and then the dielectric layer 210a at the memory cell region 202 and at the first circuit region 204a is removed to keep the dielectric layer 210a at the second circuit region 204b. Then, the dielectric layer 210c is formed on the substrate 200, and then the dielectric layer 210c at the memory cell region 202 is removed to keep the dielectric layer 210c at the first circuit region 204a. Thereafter, the dielectric layer 210b is formed on the memory cell region 202. In another embodiment of the invention, after the dielectric layer 210a at the memory cell region 202 is removed, the dielectric layer 210b and the dielectric layer 210c can be formed in a same manufacturing process, where the thickness of the dielectric layer 210b and the thickness of the dielectric layer 210c are the same. A material of the dielectric layer 210a, the dielectric layer 210b and the dielectric layer 210c is, for example, silicon oxide. A method for forming the dielectric layer 210a, the dielectric layer 210b and the dielectric layer 210c is, for example, a thermal oxidation method.

Figure 2B:
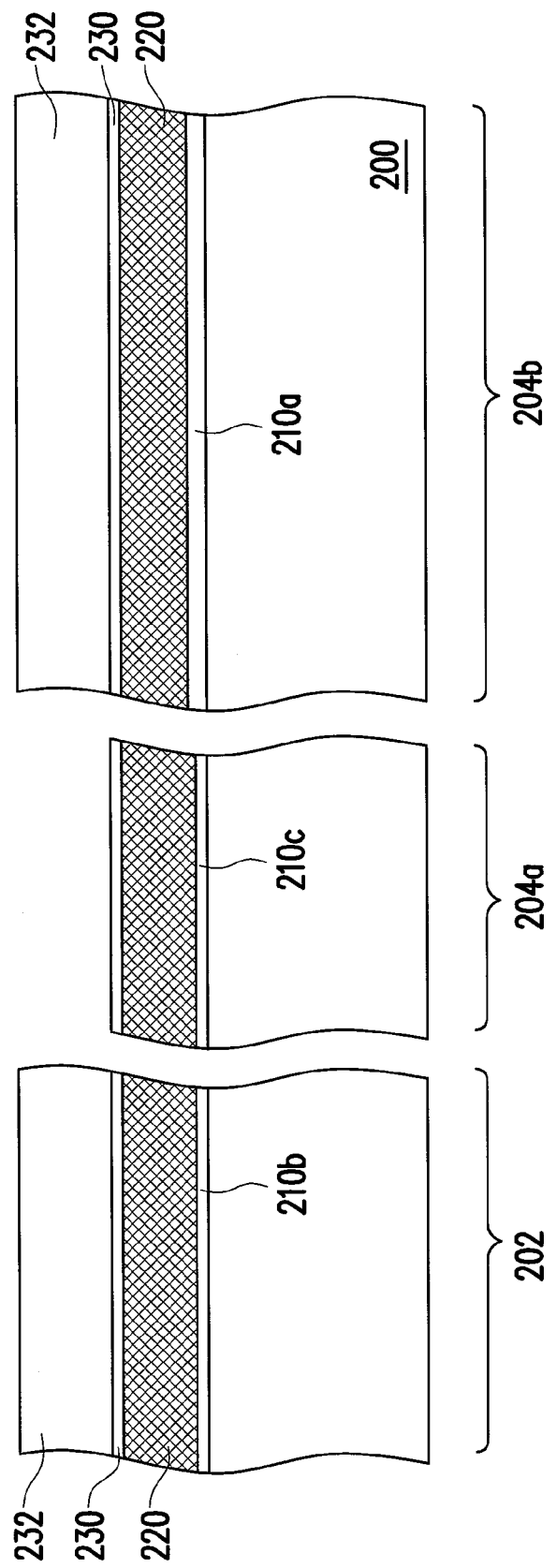

Referring to FIG. 2B, a layer of conductive material layer 220 is formed on the substrate 200, where a material of the conductive material layer 220 is, for example, doped polysilicon, etc. When the material of the conductive material layer 220 is doped polysilicon, the conductive material layer 220 can be formed by forming a layer of undoped polysilicon layer through chemical vapor deposition first, and then performing ion implantation, or the conductive material layer 220 can be formed through chemical vapor deposition by adopting in-situ dopant implantation.

Then, a layer of dielectric layer 230 is formed on the substrate 200. A material of the dielectric layer 230 is, for example, silicon oxide/silicon nitride/silicon oxide, and a method of forming the dielectric layer 230 is, for example, to form a layer of bottom silicon oxide layer through thermal oxidation first, and form a layer of silicon nitride layer through chemical vapor deposition, and then form a top silicon oxide layer on the silicon nitride layer.

Then, a layer of patterned photoresist layer 232 is formed on the substrate 200, where the patterned photoresist layer 232 covers the whole memory cell region 202 and the second circuit region 204b. A method of forming the patterned photoresist layer 232 is, for example, to form a layer of photoresist material layer on the whole substrate 200 first, and then form the patterned photoresist layer 232 through exposure and developing.

Figure 2C:
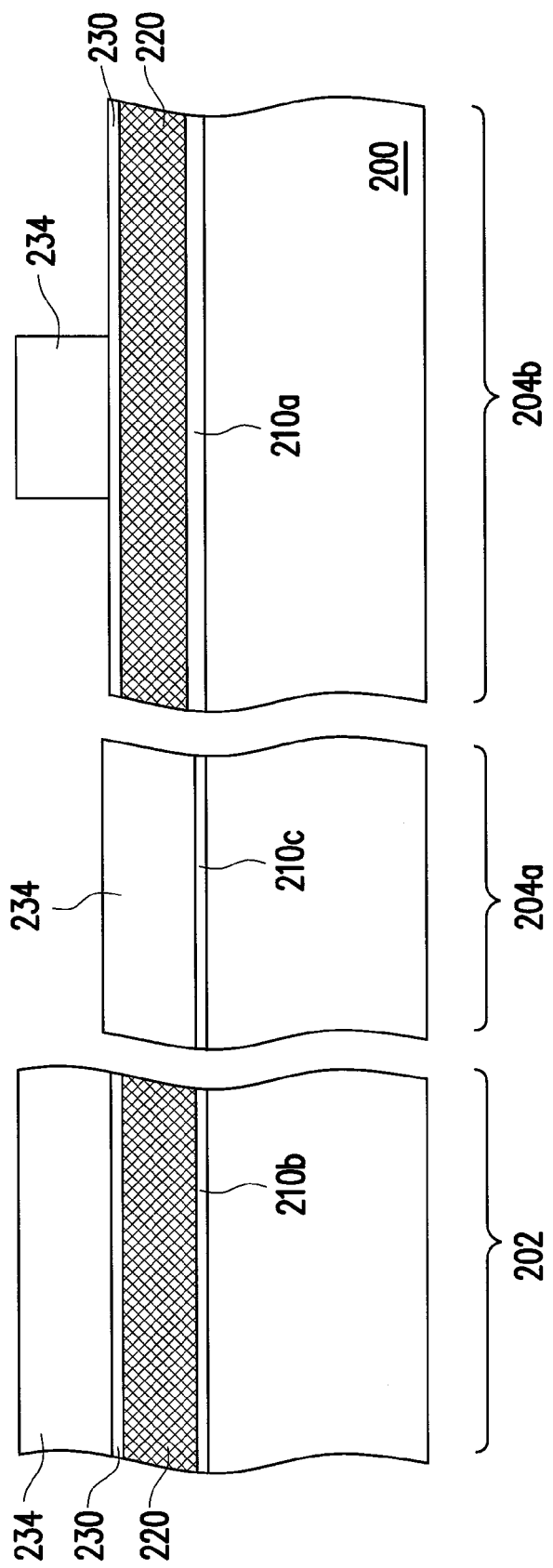

Referring to FIG. 2C, the patterned photoresist layer 232 is used as a mask to remove the dielectric layer 230 and conductive material layer 220 of the first circuit region 204a. The dielectric layer 230 and the conductive layer 220 is, for example, removed through an anisotropic etching process. Then, the patterned photoresist layer 232 is removed. A method of removing the patterned photoresist layer 232 is, for example, a wet dephotoresist method or a dry dephotoresist method. Then, a layer of patterned photoresist layer 234 is formed on the substrate 200, where the patterned photoresist layer 234 covers the whole memory cell region 202, the whole first circuit region 204a and a part of the second circuit region 204b. A method of forming the patterned photoresist layer 234 is, for example, to form a layer of photoresist material layer on the whole substrate 200 first, and then form the patterned photoresist layer 234 through exposure and developing.

Figure 2D:
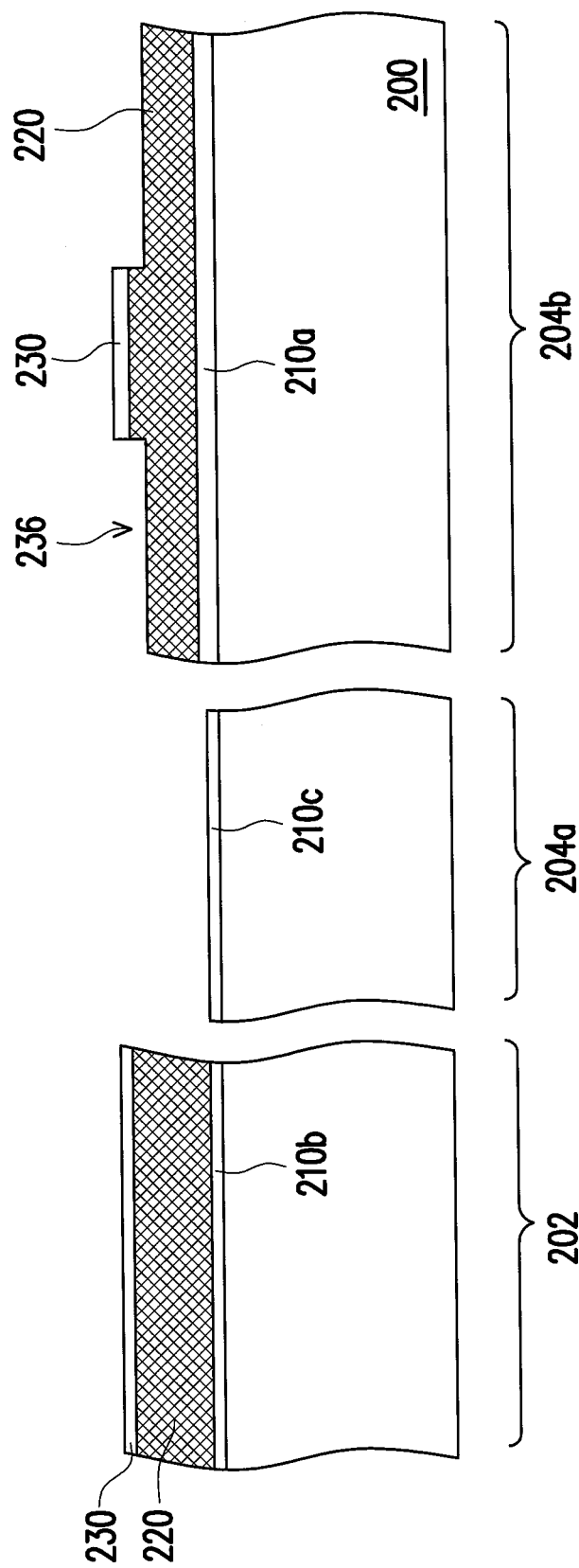

Referring to FIG. 2D, the patterned photoresist layer 234 is used as a mask to remove the dielectric layer 230 of a part of the second circuit region 204b, such that an opening 236 exposing the conductive layer 220 is formed around the dielectric layer 230 of the second circuit region 204b. Then, a part of the conductive layer 220 of the second circuit region 204b is removed. The step of removing the dielectric layer 230 and the conductive layer 220 of a part of the second circuit region 204b can be implemented in a same manufacturing process, or can be separately implemented. The dielectric layer 230 and the conductive layer 220 is, for example, removed through an anisotropic etching process. Then, the patterned photoresist layer 234 is removed. A method of removing the patterned photoresist layer 234 is, for example, a wet dephotoresist method or a dry dephotoresist method.

Figure 2E:
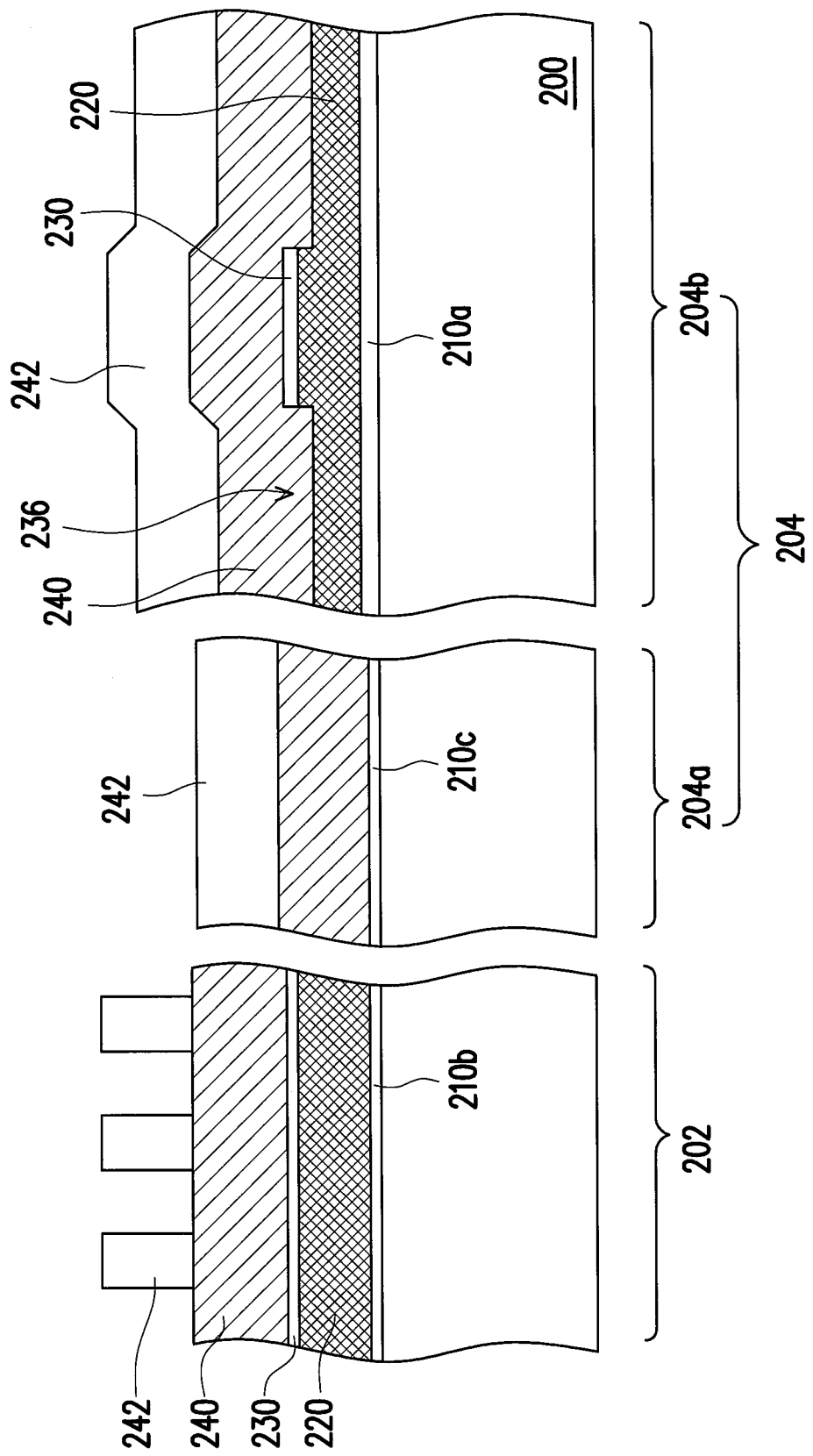

Referring to FIG. 2E, a layer of conductive material layer 240 is formed on the whole substrate 200, and a material of the conductive material layer 240 is, for example, doped polysilicon or polysilicon metal, etc. When the material of the conductive material layer 240 is doped polysilicon, the conductive material layer 240 can be formed by forming a layer of undoped polysilicon layer through chemical vapor deposition first, and then performing ion implantation, or the conductive material layer 240 can be formed through chemical vapor deposition by adopting in-situ dopant implantation.

Then, another layer of patterned photoresist layer 242 is formed on the substrate 200, where the patterned photoresist layer 242 covers a part of the memory cell region 202, all the first circuit region 204a and all the second circuit region 204b. A method of forming the patterned photoresist layer 242 is, for example, to form a layer of photoresist material layer on the whole substrate 200 first, and then form the patterned photoresist layer 242 through exposure and developing.

Figure 2F:
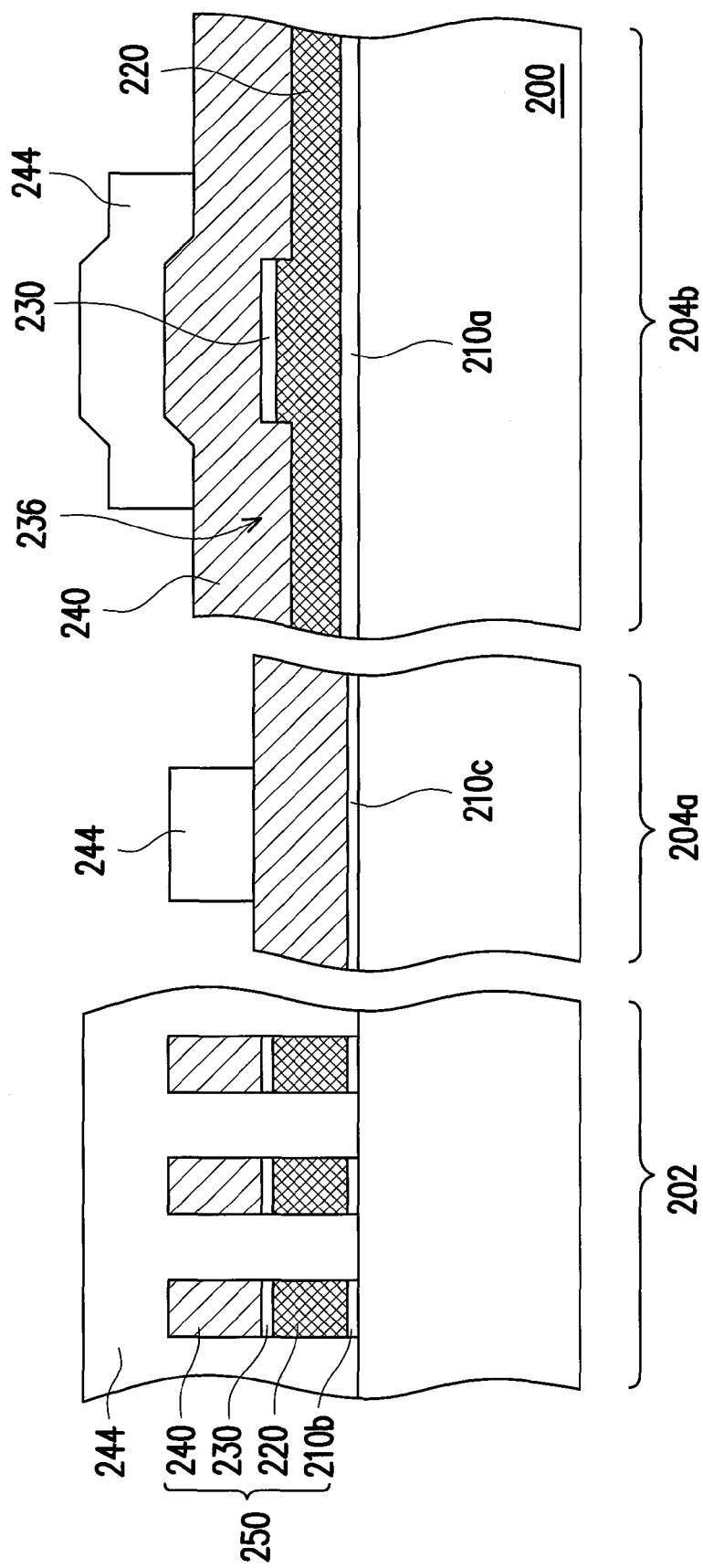

Referring to FIG. 2F, the patterned photoresist layer 242 is used as a mask to remove a part of the conductive layer 240, the dielectric layer 230, the conductive layer 220 and the dielectric layer 210b of the memory cell region 202. A method of removing the conductive layer 240, the dielectric layer 230, the conductive layer 220 and the dielectric layer 210b is, for example, a wet etching method or a dry etching method.

Then, the patterned photoresist layer 242 is removed. A method of removing the patterned photoresist layer 242 is, for example, a wet dephotoresist method or a dry dephotoresist method. Now, memory units 250 are formed in the memory cell region 202.

The memory unit 250 includes the conductive layer 240, the dielectric layer 230, the conductive layer 220 and the dielectric layer 210b. The conductive layer 240 serves as a control gate, the dielectric layer 230 serves as an inter-gate dielectric layer, the conductive layer 220 serves as a floating gate, and the dielectric layer 210b serves as a tunnelling dielectric layer.

Then, another layer of patterned photoresist layer 244 is formed on the substrate 200, where the patterned photoresist layer 244 covers all the memory cell region 202, a part of the first circuit region 204a and a part of the second circuit region 204b. A method of forming the patterned photoresist layer 244 is, for example, to form a layer of photoresist material layer on the whole substrate 200 first, and then form the patterned photoresist layer 244 through exposure and developing.

Figure 2G:
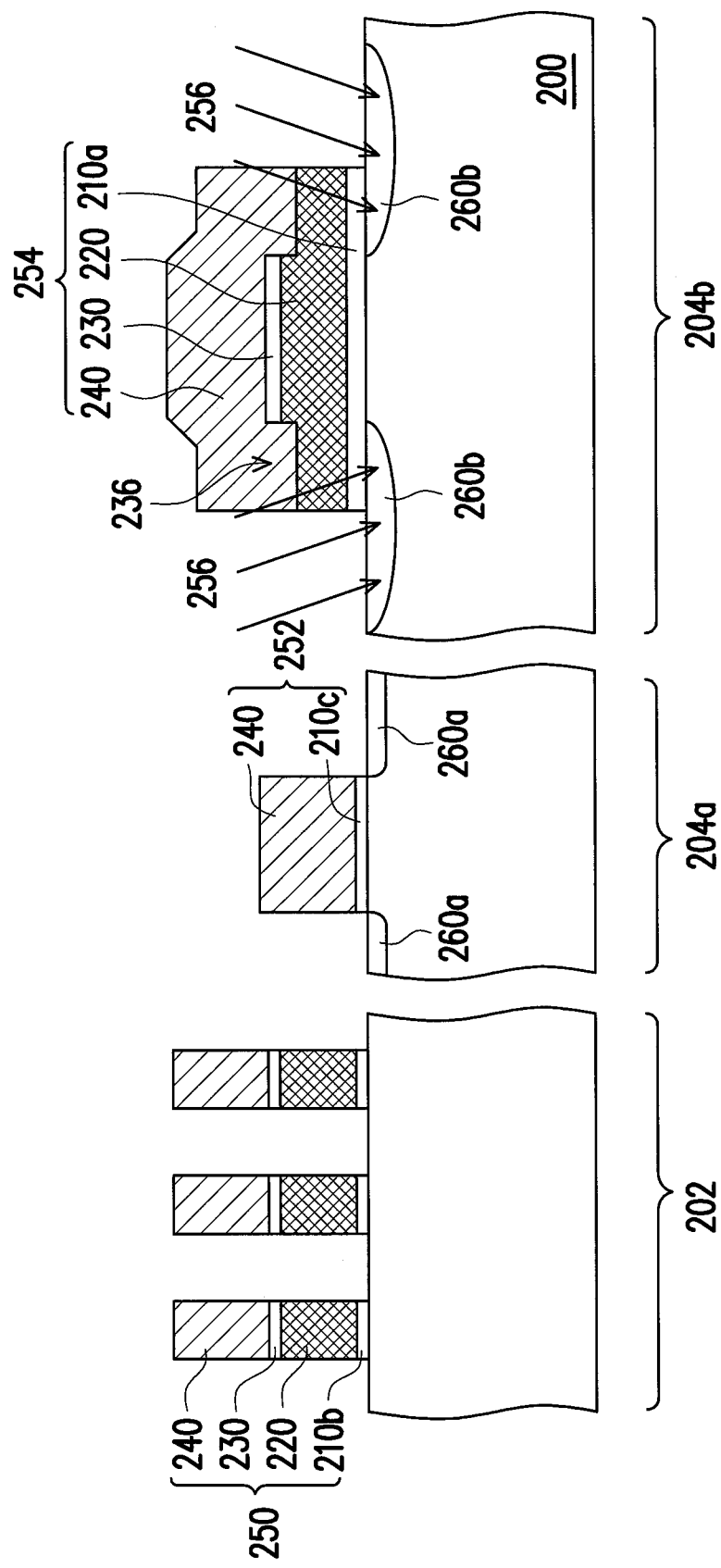

Referring to FIG. 2G, the patterned photoresist layer 244 is used as a mask to remove a part of the conductive layer 240, the conductive layer 220, the dielectric layer 210a and the dielectric layer 210c of the first circuit region 204a and the second circuit region 204b. A method of removing the conductive layer 240, the conductive layer 220, the dielectric layer 210a and the dielectric layer 210c is, for example, a wet etching method or a dry etching method.

Then, the patterned photoresist layer 244 is removed. A method of removing the patterned photoresist layer 244 is, for example, a wet dephotoresist method or a dry dephotoresist method. Now, a gate structure 252 is formed in the first circuit region 204a. Meanwhile, a stacked gate structure 254 is formed in the second circuit region 204b.

The gate structure 252 includes the conductive layer 240 and the dielectric layer 210c. The conductive layer 240 serves as a gate, and the dielectric layer 210c serves as a gate dielectric layer.

The stacked gate structure 254 includes the conductive layer 240, the dielectric layer 230, the conductive layer 220 and the dielectric layer 210a. The dielectric layer 230 of the stacked gate structure 254 has the opening 236 there around, such that the conductive layer 240 is electrically connected to the conductive layer 220. The conductive layer 240, the dielectric layer 230 and the conductive layer 220 serve as a gate, and the dielectric layer 210a serves as a gate dielectric layer.

In the present embodiment, the memory units 250 is earlier formed in a patterning manufacturing process, and then, the gate structure 252 and the stacked gate structure 254 are formed in a same patterning manufacturing process. Certainly, the memory units 250, the gate structure 252 and the stacked gate structure 254 can be formed in a same patterning manufacturing process or in different patterning manufacturing processes.

Then, lightly doped regions 260a are formed in the substrate 200 at sides of the gate structure 252. Meanwhile, lightly doped regions 260b are formed in the substrate 200 under the opening 236 at sides of the stacked gate structure 254. A method of forming the lightly doped regions 260a and the lightly doped regions 260b is, for example, to perform a title angle ion implantation by using the gate structure 252 in the first circuit region 204a as a mask and by using the dielectric layer 230 in the second circuit region 204b as a mask. A dopant of the implantation can be an N-type or a P-type dopant, which is determined according to an actual device design. In this way, a part of the lightly doped region 260b in the second circuit region 204b extends to a part of the substrate 200 under the dielectric layer 230. The lightly doped regions 260a and the lightly doped regions 260b can be formed in a same ion implantation manufacturing process or in different ion implantation manufacturing processes. In another embodiment, only the lightly doped regions 260b are formed in the second circuit region 204b.

Figure 2H:
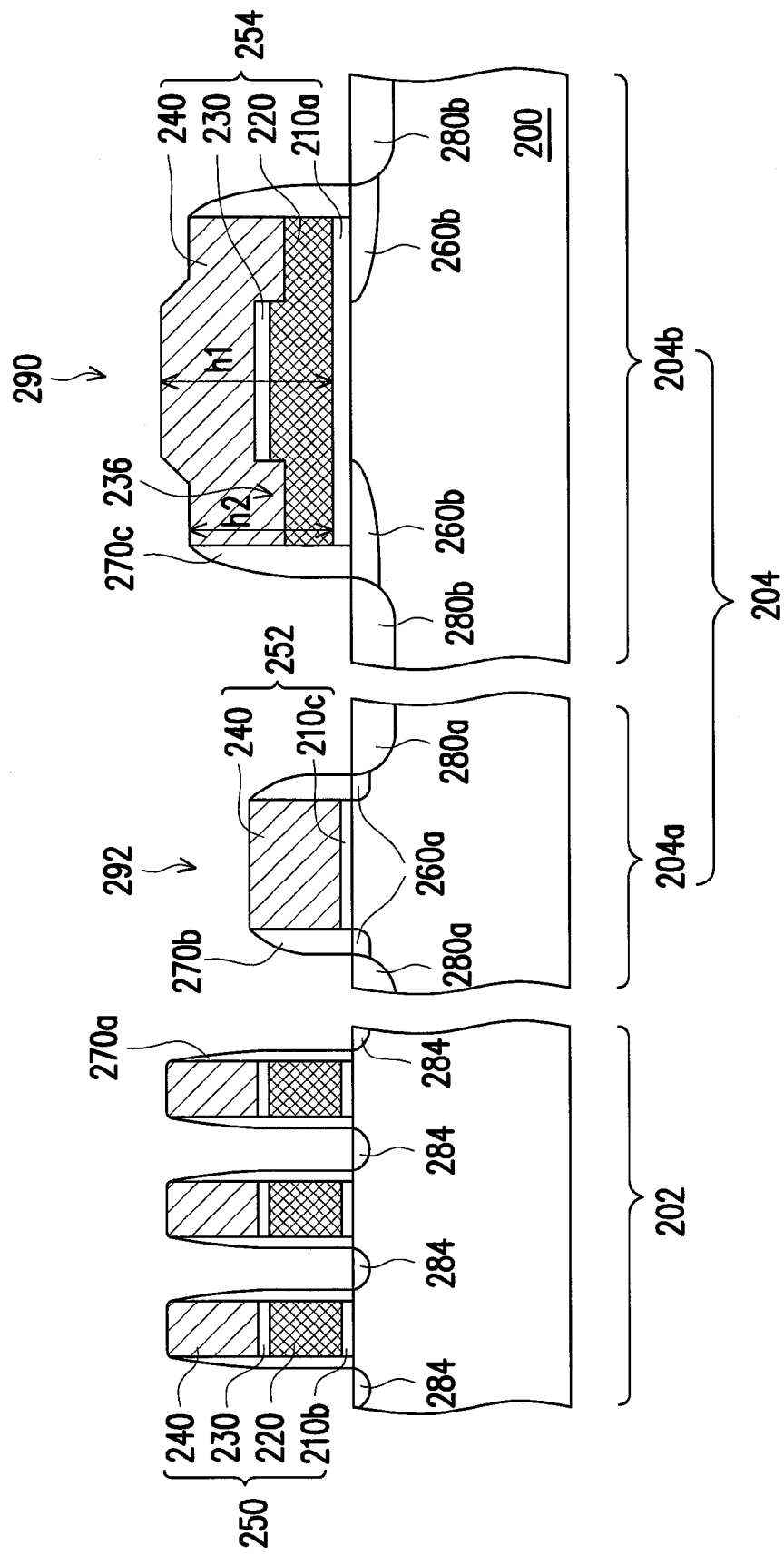

Referring to FIG. 2H, spacers 270a are formed on sidewalls of the memory units 250, a spacer 270b is formed on a sidewall of the gate structure 252, and a spacer 270c is formed on a sidewall of the stacked gate structure 254. A method of forming the spacers 270a, the spacer 270b and the spacer 270c can be as follows. First, an insulation layer (not shown) is formed on the substrate 200, where the insulation layer covers the memory units 250, the gate structure 252 and the stacked gate structure 254; a material of the insulation layer is, for example, silicon nitride, and the insulation layer is, for example, formed through chemical vapor deposition. Then, an anisotropic etching process is performed to remove a part of the insulation layer to form the spacers 270a, the spacer 270b and the spacer 270c.

Then, source/drain regions 280a are formed in the substrate 200 at sides of the gate structure 252. Meanwhile, source/drain regions 280b are formed in the substrate 200 at sides of the stacked gate structure 254. A method of forming the source/drain regions 280a and the source/drain regions 280b is, for example, to perform a ion implantation process while in the first circuit regions 204a taking the gate structure 252 having the spacer 270b as a mask and in the second circuit region 204b taking the stacked gate structure 254 having the spacer 270c as a mask. A dopant of the implantation can be an N-type or a P-type dopant, which is determined according to an actual device design. The source/drain regions 280a and the source/drain regions 280b can be formed in a same ion implantation manufacturing process or in different ion implantation manufacturing processes.

Meanwhile, a first semiconductor transistor 292 is formed in the first circuit region 204a and a second semiconductor transistor 290 is formed in the second circuit region 204b. The first semiconductor transistor 292 includes the gate structure 252, the lightly doped regions 260a, the spacer 270b and the source/drain regions 280a. The second semiconductor transistor 290 includes the stacked gate structure 254, the lightly doped regions 260b, the spacer 270c, and the source/drain regions 280b. The first semiconductor transistor 292 is, for example, a standard operating voltage transistor. The second semiconductor transistor 290 is, for example, a middle operating voltage transistor or a high operating voltage transistor.

Now, in the second circuit region 204b, a width of the formed lightly doped region 260b is determined by a width of the part of the lightly doped region 260b extending to the underneath of the stacked gate structure 254 and a width of the spacer 270c. The width of the spacer 270c relates to a height of a periphery of the stacked gate structure 254. Therefore, by controlling the height of the conductive layer 220 exposed by the opening 236, a height h1 of a center of the stacked gate structure 254 is greater than the height h2 of the periphery of the stacked gate structure 254, such that the width of the spacer 270c of the second semiconductor transistor 292 can be adjusted, by which margins of the lightly doped regions 260b of the second semiconductor transistor 292 are gained to achieve good electrical properties of the second semiconductor transistor 292.

Then, doped regions 284 are formed in the substrate 200 at sides of each of the memory units 250. A method of forming the doped regions 284 is, for example, to perform an ion implantation process while taking the memory unit 250 having the spacers 270a as a mask. A dopant of the implantation can be an N-type or a P-type dopant, which is determined according to an actual device design. The source/drain regions 280a, the source/drain regions 280b and the doped regions 284 can also be formed in the same ion implantation process.

In the manufacturing method of the flash memory, a height of the gate of the second semiconductor transistor 290 is greater than a height of the gate of the first semiconductor transistor 292, such that the width of the spacer 270c of the second semiconductor transistor 290 is greater than the width of the spacer 270b of the first semiconductor transistor 292. The width of the spacer 270c of the second semiconductor transistor 290 can be adjusted by adjusting the height of the conductive layer 220 under the opening 236. The second semiconductor transistor 290 has the wide spacer 270c, and further has the wide lightly doped regions 260b, where the lightly doped regions 260b are formed by using the dielectric layer 230 as a mask, and during the manufacturing process, none extra lithography etching process is required, so as to gain the margins of the lightly doped regions 260b. Moreover, when the lightly doped regions 260b of the second semiconductor transistor 290 are formed, a title angle ion implantation is performed by using the dielectric layer 230 having the opening there around as a mask, such that the lightly doped regions 260b extend to the underneath of the gate to gain the margins of the lightly doped regions 260b.

In summary, in the semiconductor transistor and the manufacturing method thereof, since the dielectric layer having the opening there around is disposed in the semiconductor transistor, the dielectric layer having the opening there around is used as a mask to remove a part of the conductive layer exposed by the opening, such that the height of the center of the gate is greater than the height of the periphery of the gate. In this way, the width of the spacer of the semiconductor transistor can be adjusted to gain the margins of the lightly doped regions of the semiconductor transistor, so as to achieve good electrical properties of the semiconductor transistor.

In the semiconductor transistor and the manufacturing method thereof, since the dielectric layer having the opening there around is disposed in the semiconductor transistor, when the lightly doped regions are formed, the dielectric layer having the opening there around is used as an implantation mask, and the lightly doped regions extend to the underneath of the gate.

In the semiconductor transistor and the manufacturing method thereof, since the gate of the semiconductor transistor is composed of two layers of conductive layers, a height of the gate is higher than a height of the gate of other core transistor or input/output transistor.

In the flash memory and the manufacturing method thereof, the memory unit, the first semiconductor transistor and the second semiconductor transistor are formed together in a same manufacturing process. Since the dielectric layer having the opening there around is disposed in the second semiconductor transistor, when the dielectric layer having the opening there around is used as a mask to remove a part of the conductive layer exposed by the opening, the height of the center of the gate is greater than the height of the periphery of the gate. In this way, the width of the spacer of the second semiconductor transistor can be adjusted to gain the margins of the lightly doped regions of the second semiconductor transistor, so as to achieve good electrical properties of the second semiconductor transistor.

In the flash memory and the manufacturing method thereof, the dielectric layer having the opening there around is disposed in the second semiconductor transistor. When the lightly doped regions are formed, the dielectric layer having the opening there around is used as an implantation mask, and the lightly doped regions extend to the underneath of the gate.

In the flash memory and the manufacturing method thereof, since the gate of the second semiconductor transistor is composed of two layers of conductive layers, the height of the gate is higher than the height of the first semiconductor transistor.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor transistor, comprising:
a stacked gate structure, disposed on a substrate, and comprising a gate dielectric layer, a first conductive layer, a dielectric layer and a second conductive layer sequentially disposed on the substrate, wherein the dielectric layer has an opening there around such that the first conductive layer is electrically connected to the second conductive layer;
lightly doped regions, respectively disposed in the substrate under the opening at sides of the stacked gate structure; and
source/drain regions, disposed in the substrate at sides of the stacked gate structure.

2. The semiconductor transistor as claimed in claim 1, wherein the semiconductor transistor is a middle operating voltage transistor or a high operating voltage transistor.

3. The semiconductor transistor as claimed in claim 1, wherein the dielectric layer is silicon oxide/silicon nitride/silicon oxide.

4. A manufacturing method for a semiconductor transistor, comprising:
providing a substrate;
sequentially forming a gate dielectric layer, a first conductive layer and a dielectric layer on the substrate;
removing a part of the dielectric layer to an opening exposing the first conductive layer which surrounds the dielectric layer;
forming a second conductive layer on the substrate, wherein the second conductive layer is electrically connected to the first conductive layer though the opening;
patterning the second conductive layer, the first conductive layer and the gate dielectric layer to form a stacked gate structure, wherein the dielectric layer is located in the stacked gate structure;
forming lightly doped regions in the substrate under the opening at sides of the stacked gate structure; and
forming source/drain regions in the substrate at sides of the stacked gate structure.

5. The manufacturing method for the semiconductor transistor as claimed in claim 4, wherein the dielectric layer is silicon oxide/silicon nitride/silicon oxide.

6. The manufacturing method for the semiconductor transistor as claimed in claim 4, wherein the step of forming the lightly doped regions in the substrate under the opening at sides of the stacked gate structure comprises:
performing a tilt angle ion implantation by using the dielectric layer as a mask.

7. The manufacturing method for the semiconductor transistor as claimed in claim 4, wherein the step of removing a part of the dielectric layer to form the opening exposing the first conductive layer further comprises:
removing a part of the first conductive layer.

8. A flash memory, disposed on a substrate, wherein the substrate comprises a memory cell region, a first circuit region and a second circuit region, the flash memory comprising:
a memory unit, disposed in the memory cell region, and comprising a tunnelling dielectric layer, a floating gate, an inter-gate dielectric layer and a control gate sequentially disposed on the substrate;
a first semiconductor transistor, disposed in the first circuit region, and comprising:
a gate structure, disposed on a substrate, and comprising a first gate dielectric layer and a first gate sequentially disposed on the substrate
first source/drain regions, disposed in the substrate at sides of the gate structure; and
a second semiconductor transistor, disposed in the second circuit region, and comprising:
a stacked gate structure, disposed on a substrate, and comprising a second gate dielectric layer, a first conductive layer, a dielectric layer and a second conductive layer sequentially disposed on the substrate, wherein the dielectric layer has an opening there around such that the first conductive layer is electrically connected to the second conductive layer to form a second gate;
first lightly doped regions, disposed in the substrate under the opening at sides of the stacked gate structure; and
second source/drain regions, disposed in the substrate at sides of the stacked gate structure.

9. The flash memory as claimed in claim 8, wherein materials of the inter-gate dielectric layer and the dielectric layer are the same.

10. The flash memory as claimed in claim 8, wherein the height of the second gate is greater than the height of the first gate.

11. The flash memory as claimed in claim 8, further comprising:
spacers, respectively disposed at sidewalls of the memory unit, the gate structure and the stacked gate structure.

12. The flash memory as claimed in claim 11, wherein a width of the spacer of the second semiconductor transistor is greater than a width of the spacer of the first semiconductor transistor.

13. The flash memory as claimed in claim 8, wherein the first semiconductor transistor is a standard operating voltage transistor.

14. The flash memory as claimed in claim 8, wherein the second semiconductor transistor is a middle operating voltage transistor or a high operating voltage transistor.

15. The flash memory as claimed in claim 8, wherein the first semiconductor transistor further includes second lightly doped regions disposed in the substrate between the gate structure and the first source/drain regions.

16. A manufacturing method for a flash memory, comprising:
   providing a substrate, wherein the substrate comprises a memory cell region, a first circuit region and a second circuit region;
   forming a first dielectric layer on the substrate at the second circuit region;
   forming a second dielectric layer on the substrate at the memory cell region;
   forming a third dielectric layer on the substrate at the first circuit region;
   forming a first conductive layer on the substrate;
   forming a dielectric layer is formed on the first conductive layer;
   removing the dielectric layer in the first circuit region and a part of the dielectric layer in the second circuit region, and forming an opening exposing the first conductive layer around the dielectric layer at the second circuit region;
   removing the first conductive layer in the first circuit region;
   forming a second conductive layer on the substrate, wherein in the second circuit region, the second conductive layer is electrically connected to the first conductive layer through the opening;
   patterning the second conductive layer, the dielectric layer and the first conductive layer to form a memory unit in the memory cell region, a gate structure in the first circuit region and a stacked gate structure in the second circuit region, wherein the dielectric layer is located in the stacked gate structure with the opening;
   forming lightly doped regions in the substrate under the opening at sides the of the stacked gate structure; and
   forming source/drain regions in the substrate at sides of the stacked gate structure.

17. The manufacturing method for the flash memory as claimed in claim 16, wherein the dielectric layer is silicon oxide/silicon nitride/silicon oxide.

18. The manufacturing method for the flash memory as claimed in claim 16, wherein the step of forming the lightly doped regions in the substrate under the opening at sides of the stacked gate structure comprises:
   performing a tilt angle ion implantation by using the dielectric layer as a mask.

19. The manufacturing method for the flash memory as claimed in claim 16, wherein the step of removing a part of the dielectric layer to form the opening exposing the first conductive layer further comprises:
   removing a part of the first conductive layer.

* * * * *